(12) United States Patent
Wilsher

(10) Patent No.: US 6,781,218 B1
(45) Date of Patent: Aug. 24, 2004

(54) METHOD AND APPARATUS FOR ACCESSING INTERNAL NODES OF AN INTEGRATED CIRCUIT USING IC PACKAGE SUBSTRATE

(75) Inventor: Kenneth Wilsher, Palo Alto, CA (US)

(73) Assignee: NPTest, Inc., San Jose, CA (US)

(*) Notice: Subject to any disclaimer, the term of this patent is extended or adjusted under 35 U.S.C. 154(b) by 0 days.

(21) Appl. No.: 10/382,343

(22) Filed: Mar. 4, 2003

(51) Int. Cl.[7] .............................................. H01L 39/00
(52) U.S. Cl. ...................... 257/662; 257/678; 257/691; 257/698; 257/48; 438/15; 438/17; 438/18
(58) Field of Search .................... 257/662, 48, 678, 257/691, 698; 438/15, 17, 18

(56) References Cited

U.S. PATENT DOCUMENTS 6,469,396 B1 * 10/2002 Kawai ........................ 257/784
6,590,409 B1 * 7/2003 Hsiung et al. ............... 324/765
6,617,181 B1 * 9/2003 Wright et al. ................. 438/18

* cited by examiner

*Primary Examiner*—Nathan Flynn
*Assistant Examiner*—Remmon R. Fordé

(57) ABSTRACT

A method and apparatus for accessing internal nodes of an integrated circuit using a package substrate are provided. Embodiments of the present invention include an integrated circuit comprising an integrated circuit die comprising a principal side; a conductive element formed on the principal side of the integrated circuit die; a package substrate comprising a principal side facing the principal side of the integrated circuit die; a conductive element located on the principal side of the package substrate; a transmission path wherein a first end of the transmission path is coupled to the conductive element of the integrated circuit die and wherein a second end of the transmission path is coupled to the conductive element of the package substrate.

22 Claims, 5 Drawing Sheets

METHOD AND APPARATUS FOR ACCESSING INTERNAL NODES OF AN INTEGRATED CIRCUIT USING IC PACKAGE SUBSTRATE

BACKGROUND OF THE INVENTION

1. Field of the Invention

The present invention relates to the field of testing integrated circuits. More specifically, embodiments of the present invention relate to accessing internal nodes of flip-chip packaged integrated circuits to measure voltage transitions at the nodes.

2. Prior Art

Measurements of voltage transitions at internal circuit nodes are needed during the development and testing of complex integrated circuits ("ICs" hereafter). A circuit node is any point on the electrical connections of the IC (e.g., an input or output terminal of a logic gate). Despite use of sophisticated simulation tools, many ICs still fail to operate as designed, and diagnostic procedures must be undertaken to determine the cause of the failure. In some instances, mechanical probing and beam (electron beam) probing provide the requisite information. However, when the well-known flip-chip packaging (the die being mounted face down to its package substrate) technology is used, micromechanical and electron beam probe access to the principal (metal connection) side of the IC die is blocked.

It is known to use a light beam to measure voltage at an internal node in a conventional flip-chip packaged IC. An example of a conventional system for measuring circuit voltage at an internal node of an IC using light is IDS2000 manufactured by Schlumberger, and described in U.S. Pat. No. 5,905,577. To access the internal circuit elements, first the IC die is stripped of the package to expose the metal connection side of the IC die. A light beam is focused on a circuit element of the IC, such as a diode where the measurements are desired in the IC, from the metal connection side of the IC die.

A test program generating a series of commands (e.g., test patterns) is run on the IC, the test patterns are applied to the input pins of the IC. In response to the past patterns (vectors), voltage transitions take place at the circuit node, which is merely a point on an electrical connection to the circuit element. The light reflected from the circuit element, electrically connected to the circuit node, is modulated by changes in the electrical state of the node in response to the test patterns. Thus the reflected light provides a measure of voltage transitions (signals) at the node.

There are drawbacks associated with using this method to test integrated circuits. First, the modulation of the reflected beam is very weak and averaging techniques must be used to obtain low noise measurement waveforms. Second, many IC faults are intermittent, (e.g., in logic circuits) so that averaging will produce false results unless the IC activity is exactly repeated for every test pattern Access to such internal circuit nodes can be achieved by providing an on-chip circuit called a scan chain The test method modifies the otherwise conventional flip-flops used in the IC, providing a two input data selector to the D input terminal of each flip-flop. The data selector control signal for all the flip-flops is a common signal called Scan Enable. With Scan Enable, in the low logic state, the data selector is set for normal IC operations. However, the Q output terminal of each flip-flop is coupled to the normally unused data selector input of another flip-flop. When Scan Enable is in the high logic state, this path is enabled, forming a continuous shift register structure from all the modified and connected flip-flops. By this means, serial data representing an arbitrary logic state can be loaded from one of the IC input pins into the shift register with Scan Enable high, and normal IC operation begun from this arbitrary internal state by switching Scan Enable low. Also at any point in the normal operation of the IC, Scan Enable can be made logic high, thus latching the logic state for all internal nodes into the shift register. The contents of the shift register can then be clocked to an output pin for analysis. For a detailed description of scan test methods, see Alfred L. Crouch, "Design For Test For Digital ICs And Embedded Core Systems," Prentice Hall, 1999.

However, the scan chain operations cannot be performed at full device operating speed. The internal scan chain can give accurate information to the IC logic state only when the associated processor clock is stopped. Thus at low speed all faults may be located, but faults occurring only at high speed may elude isolation in time and position. Latching of the scan chain can be done with the DUT (device under test, referring to the IC under test) operating at full clock speed, thereby obtaining a "snap shot" of the IC internal nodes at an instant of time. However, it is difficult to distribute simultaneously to the scan chain the latching lock pulse, or at least distribute the latching clock pulse within a small fraction of the device clock speed. Because of this, the data obtained in this manner is suspect. The on-chip time relationship between voltage transitions on two nodes is not accurately represented in the data obtained in this manner. This skew distribution problem becomes worse as the number of active circuits contained in a DUT increase.

Thus, it would be desirable to provide access to circuit nodes of a DUT to obtain reliable measurements of faults occurring at high speed. It would also be advantageous to provide signal outputs to an associated printed circuit board from internal circuit nodes for diagnostic purposes. However, the incremental cost of providing these connections will be very high, because a larger surface area package will be needed, and the difficulty of routing all the connections on the printed circuit board would be increased. This cost would have to be borne by every IC produced, even after the diagnostic process had been completed and the extra no longer needed. Hence, this would not be economical.

SUMMARY OF THE INVENTION

Accordingly, what is needed is a solution to the problems associated with conventional IC testing. The present invention provides access to the electrical state of the internal nodes of an IC DUT.

The well-known flip-chip method of packaging ICs has greatly increased the available number of electrical connections between the IC die and the associated mounting substrate of the IC package. ("Package" in the IC field refers to the plastic or ceramic housing for the die and its associated electrical leads.) In an integrated circuit, in accordance with an embodiment of the present invention, each electrical connection between the IC die and the top of the package substrate is made by a deformable "ball bond." The ball bonds can be made anywhere on the IC die surface; they are not constrained to the edge of the die. The package substrate is a multi-layered polyimide or ceramic structure, containing power planes (conductors) and impedance controlled signal transmission lines. The package substrate power planes and signal transmission lines are coupled by interlayer vertical connections (vias) to a flat pad or a pin on the bottom layer of the package substrate. The pads or pins are used conventionally to make electrical connections to the associated printed circuit board on which the package IC is mounted. A number of the ball bonds are used for power and ground connections to the substrate, so that the high current required by the IC is carried by many such bonds. The number of ball bonds may exceed, e.g., two thousand and hence many are also available to carry signals from internal nodes of the IC to the multi-layered package substrate.

In one embodiment a circuit internal node on the IC is coupled to a buffer on chip to drive the node's signal onto a path including an associated ball bond and a trace (conductor) that Is terminated in a pad on the top (principal) surface of the package substrate. An example of a buffer (amplifier) is an inverter. The pad is located beyond the edge of the die, thereby, being readily accessible by the test apparatus and is not used as a signal path for normal IC operations. There is sufficient space around the edges of the IC die on the top surface of a typical sized package substrate to place up to, e.g., 100 such pads. One embodiment of the present invention includes a package substrate that has more layers and is used for the testing (diagnostic) process only, thus avoiding the extra cost of using this special (diagnostic) package substrate with production IC's.

In another embodiment of the present invention, the buffer (amplifier) at the IC internal node is sized to output only about a hundred millivolt signal when the output diagnostic pad coupled to the internal circuit node is loaded with fifty ohm impedance. The area of the IC die taken up by the buffer is thereby minimized, and a wide band signal path impedance is obtained from the ball bond all the way to the test apparatus. In another embodiment of the present invention, a signal or data selector is set by the IC scan chain. By providing the data selector many internal nodes may be accessed sequentially.

These and other objects and advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, and components have not been described in detail as not to unnecessarily obscure aspects of the present invention.

Figure 1:
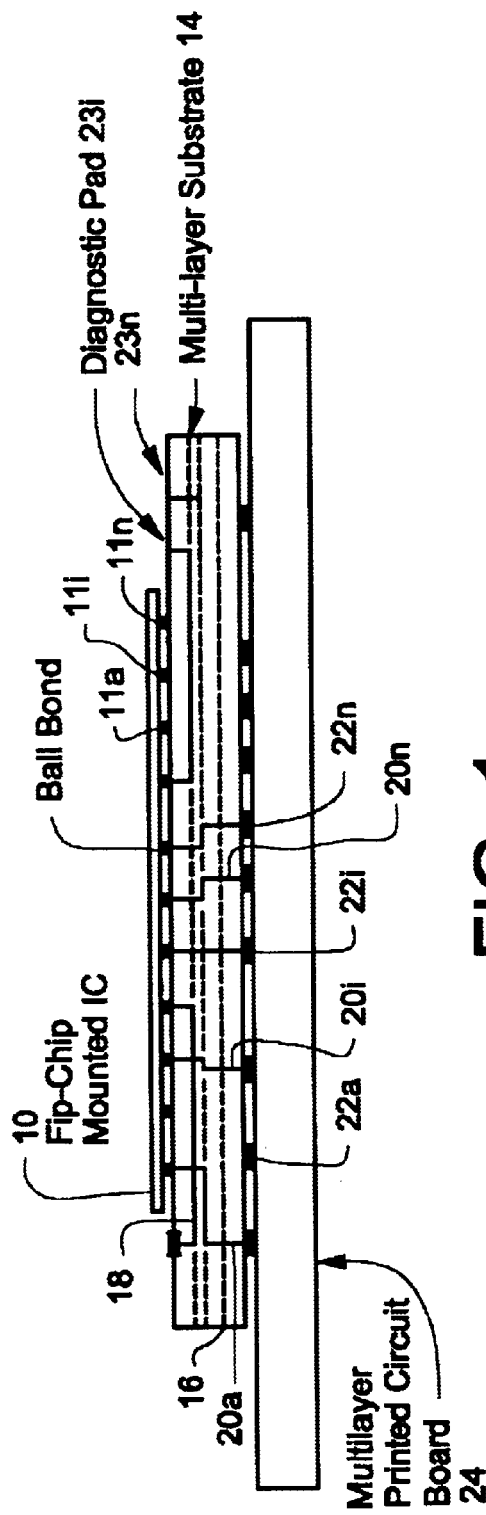
FIG. 1 is a cross sectional illustration of an exemplary integrated circuit in accordance with an embodiment of the present invention.

FIG. 1 shows (in a side view) an IC die 10 having deformable balls 11a, . . . , 11i, . . . , 11n on its principal side and mounted with the principal side down on a package substrate 14 of a type suitable for flip-chip packages. The conventional flip-chip package heat sink is not shown for purposes of the illustration. Each electrical connection between IC die 10 and the top of the package 14 hence is made by a deformable "ball bond" where each ball bond includes one of balls 11a, . . . , 11i, . . . , 11n conventionally pressed against a conductive trace on substrate 14 so as deform (flatten) the ball; ball bonds are well known in the IC packaging field. The ball bonds are thus available anywhere on the lower surface of IC die 10 and are not constrained to the edge of the IC die 10.

Package substrate 14 in one embodiment of the present invention is a multi-layered, e.g., polyimide, ceramic, or plastic (insulative) structure, containing several conductive power planes 16 (only one of which is shown) and many impedance controlled signal transmission lines 18 (only one of which is shown). Each power plane 16 or signal transmission line 18 is coupled by at least one vertically extending interlayer connection (a via) 20a, . . . , 22n to an associated conductive pad 22a, . . . 22i, . . . 22n on the lower surface of the substrate 14. Alternatively, a conductive pin extending down from substrate 14 is used instead of pads 22a, . . . , 22i, . . . , 22n are used to make electrical connections to conventional traces (not shown) on the upper surface of a supporting conventional printed circuit board 24. Some of the ball bonds on die 10 are used for power and ground connections to substrate 14, so that the high current required by IC die 10 is shared across many of the ball bonds. The number of ball bonds may exceed, e.g., two thousand and so many of them are also available to carry signals from internal nodes of IC die 10 to the substrate 14.

It is seen in FIG. 1 that substrate 14 is wider than die 10. Thus exposing contact pads 23a, . . . , 23i, . . . , 23n on the upper surface of substrate to external access from above for additional connections for diagnostic purposes. The contact pads are externally accessible to an integrated circuit test apparatus without modification of the chip prior to testing. However, the location of the externally accessible contact pads are not limited to the upper surface of the substrate package.

Figure 2:
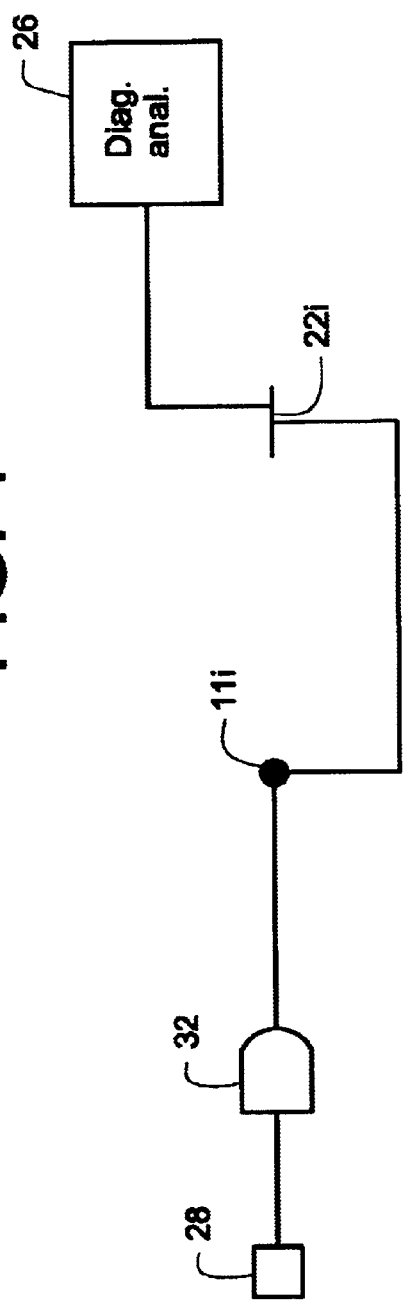
FIG. 2 is an illustration of an exemplary transmission path of the integrated circuit illustrated in FIG. 1 in accordance with an embodiment of the present invention.

FIG. 2 shows schematically an exemplary transmission path from an internal circuit node 28 of IC die 10, to an external diagnostic analyzer 26 instrument. Internal node 28 is coupled to the input terminal of a buffer 32, which in turn is coupled to ball 11i. Internal node 28, buffer 32 and ball 11i are on the principal side of IC die 10 and of course similar structures are duplicated at various locations on the principal side of IC die 10. Ball 11i is coupled to pad 22i on the principal surface of the substrate 14 by the internal conductors in substrate 14 as shown in FIG. 1. In one embodiment, if ball bond 11i was at the edge of the field of ball bonds, a direct connection could be made on the principal plane of substrate. Pad 22i is coupled to the input/output port of external diagnostic analyzer 26 (a conventional IC test instrument). The transmission path of FIG. 2, in one embodiment, has an impedance of approximately 50 ohms. Fabrication of the structures of FIGS. 1 and 2 is routine in light of the above description, to one of ordinary skill in the semiconductor field.

Figure 3:
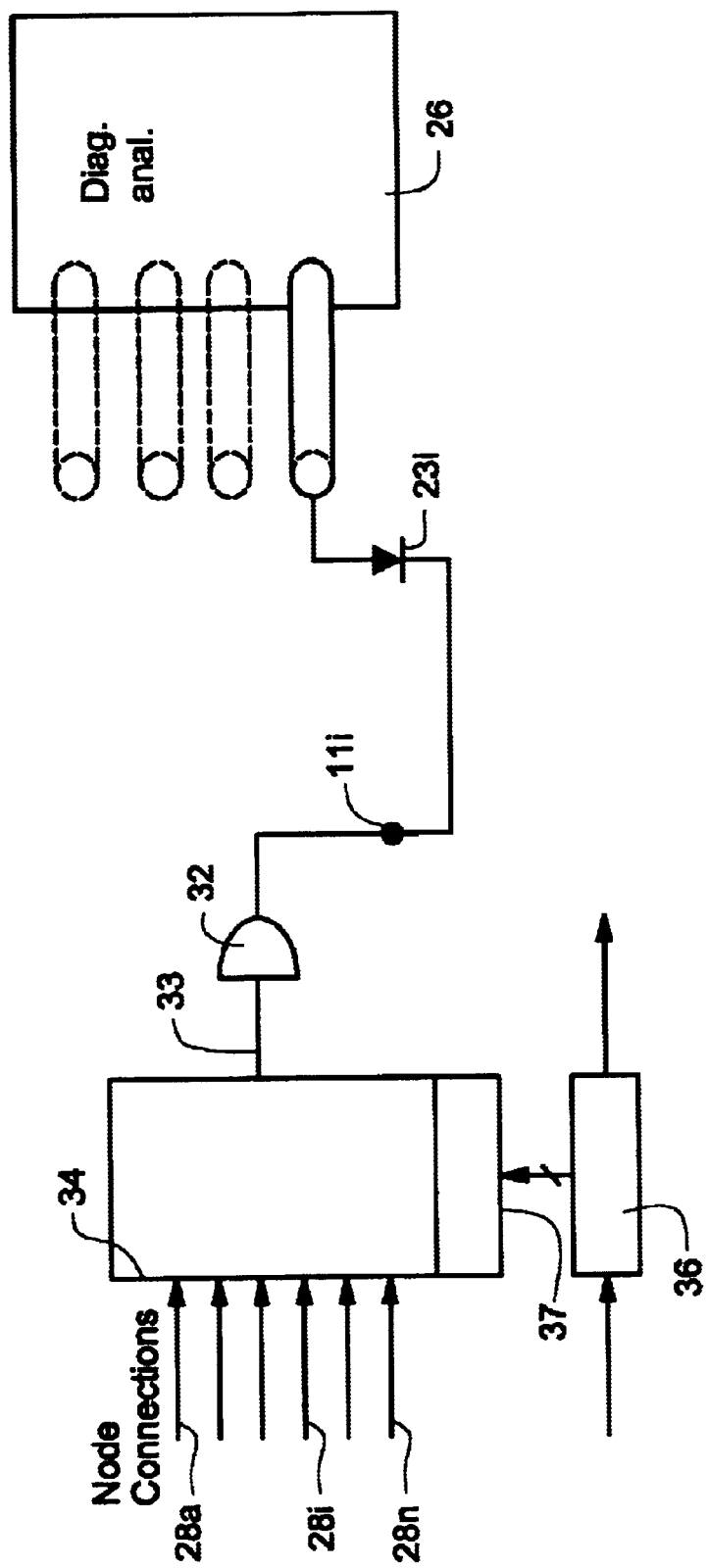
FIG. 3 is an illustration of a variation of the exemplary transmission path of FIG. 2 in accordance with an embodiment of the present invention.

FIG. 3 shows schematically the transmission path of FIG. 2 with the addition of a signal selector 43 provided at the input terminal of buffer 32. The n input terminals of data selector 34 are coupled respectively to n internal circuit nodes 28a, . . . , 28i, . . . , 28n and the output signal of data selector 34 on line 33 is coupled to the input terminal of buffer 32. The transmission path from buffer 32 to diagnostic analyzer 26 is as described above. The state of signal selector 34 is set by control signals provided by the scan chain element 36 on lines 37 thereby allowing the selection of the output signal from many nodes 28a, . . . , 28i, . . . , 28n coupled to signal selector 34.

Figure 4:
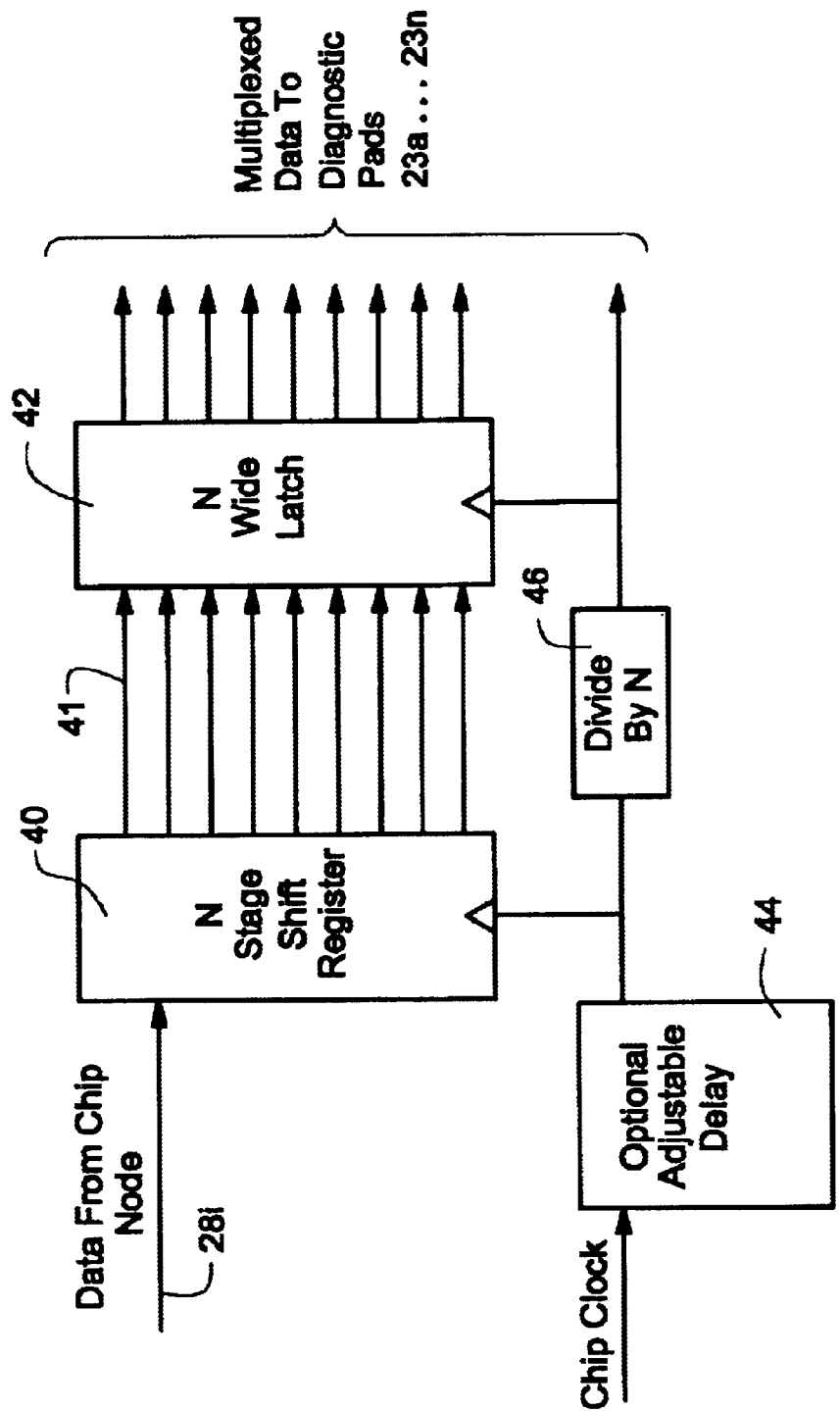
FIG. 4 is an illustration of a further variation of the exemplary transmission path illustrated in FIG. 2 in accordance with an embodiment of the present invention.

FIG. 4 shows another embodiment of the on-chip circuit wherein IC circuit node 28i is coupled to respective input terminals of N stage shift register 40. The output terminals of shift register 40 are coupled to input terminals of register (latch) 42 which stores N bits. The transmission path from latch 42 to external diagnostic analyzer 26 is via pads 23a, . . . , 23n as described above. The provision of shift register 40 on chip reduces the bandwidth requirement of the interconnections by transmitting the on-chip high speed signals first to the on-chip shift register 40 and then coupling the output signals of the shift register 40 to the ball bonds 11a, . . . , 11i, . . . , 11n and then via substrate 14 to pads 23a, . . . , 23i, . . . , 23n located on the top surface of the substrate 14 as described above.

For example, if shift register 40 is 1 to 16 (serial one signal line in and 16 out), and the maximum bandwidth of the interconnect (path from node 28 of FIG. 2 to analyzer 26 of FIG. 2) is 500 MHz, chip data at 8 GHz rate can be examined by analyzer 26. An adjustable (via a scan chain set up) clock delay 44 is provided in one embodiment on chip which allows data timing information to be obtained by an applied chip clock signal on line 46 clocking register 40 and latch 42, via divide by n logic 46.

The transmission path provided by the substrate 14 may also be used as an input path to the die 10. A signal applied to pad 23i may be used to operate on-chip latches so as to capture the logic state of internal nodes of the die 10 at the time accurately determined by the external test apparatus. One way to accomplish this is described in U.S. patent entitled "On-Chip Optically Triggered Latch For IC Time Measurement" filed by Kenneth Wilsher, U.S. Pat. No. 6,501,288 incorporated herein by reference in its entirety.

Figure 5:
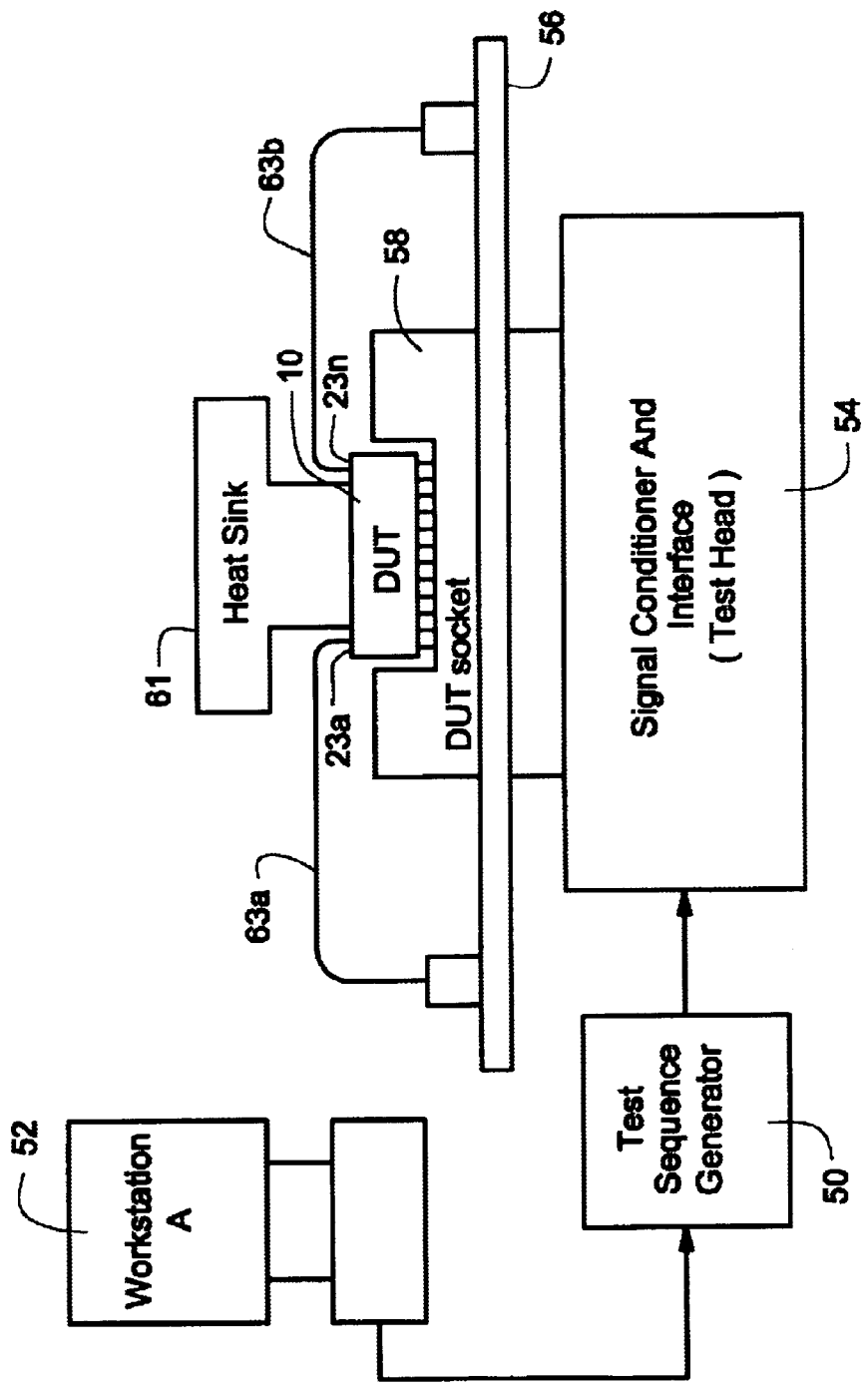
FIG. 5 illustrates testing of an IC as in FIG. 1 in accordance with an embodiment of the present invention.

FIG. 5 shows in a side view a test configuration including a test sequence generator 50 (such as the Schlumberger ITS9000IX) conventionally electrically coupled to a workstation (computer) 52. Test sequence generator 50 is coupled to conventional load board 56. The conventional DUT 58 socket is attached load board 56 on test head 54. The additional connections 63a, 63b, (only two of which are shown) to DUT die 10, provided by selected ones of pads 23a, . . . , 23i, . . . , 23n (see FIG. 2), are thereby electrically connected to the load board 56 and so can be driven by signals from test head 54, or DUT die 10 can drive signals back to the test head 56 on connections 63a, 63b. In FIG. 5, the heat sink 61 thermally coupled to the top surface of die 10 is shown.

Figure 6:
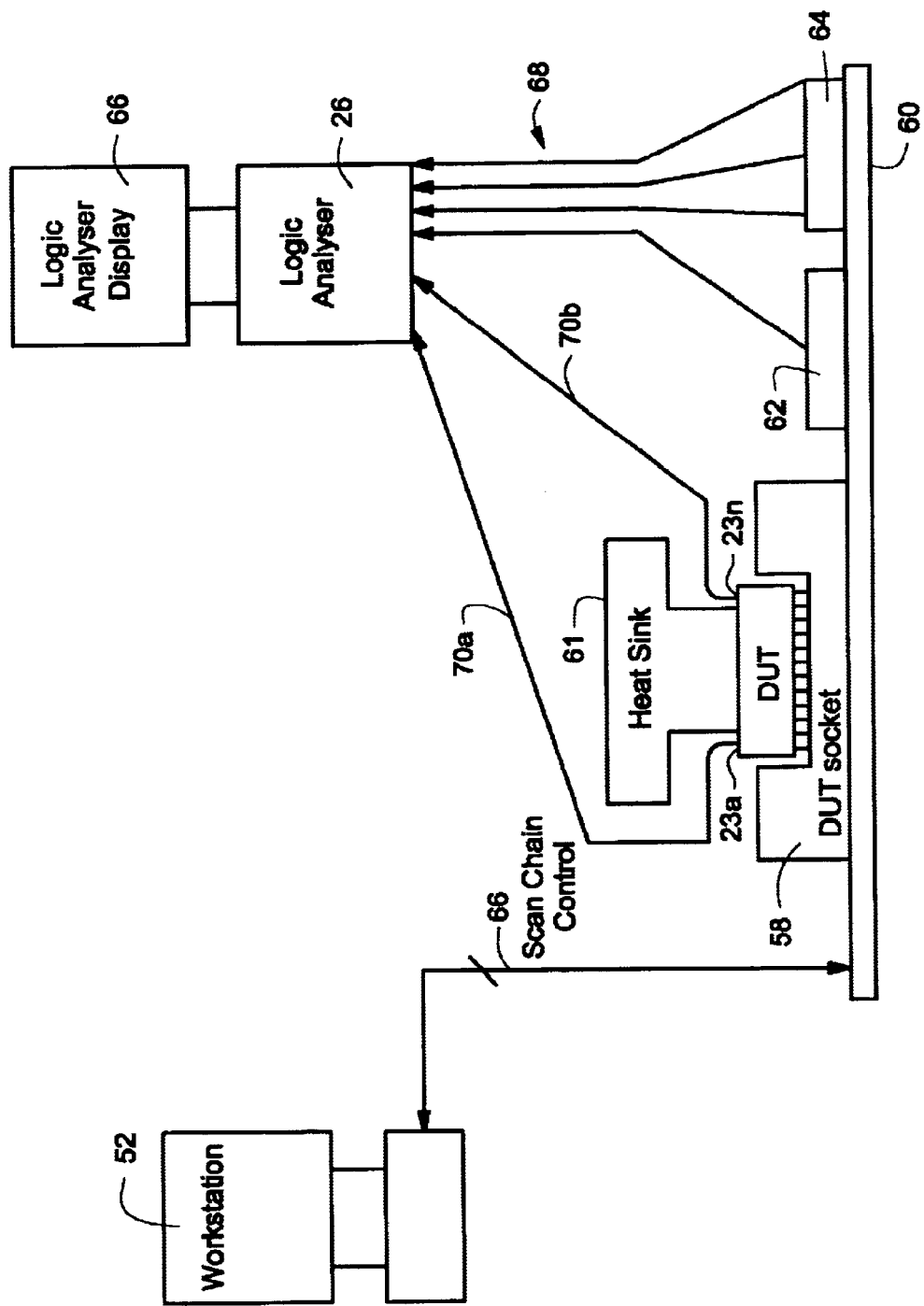
FIG. 6 illustrates testing of a system including the FIG. 1 IC in accordance with an embodiment of the present invention.

FIG. 6 shows a variation of the arrangement of FIG. 5 for a system or board test such as the test of a printed circuit board 60 using the additional substrate pads 23a, . . . , 23i, . . . , 23n. DUT 10 is mounted on board 60 having support ICs (ICs required to make the board/system) 62 and 64. Workstation 52 is coupled by bus 66 to the input terminals on board 60 and controls the system/board by sending commands via an on-chip (die 10) scan chain. For one description of sending commands via such an on chip scan chain, see the above-referenced patent entitled "On-Chip Optically Triggered Latch For IC Time Measurement" filed by Kenneth R. Wilsher, U.S. Pat. No. 6,501,288. In addition to the conventional logic analyzer 26 connections 68 to the printed circuit board 60, pads 23a, . . . , 23i, . . . , 23n provide diagnostic connections via lines 70a, 70b, etc., to internal circuit nodes of the DUT die 10.

Also provided is logic analyzer 26 (to capture data of any logic signals on the board/system) and the associated display 66, connected to board 60 by connections (bus) 68.

Embodiments of the present invention, a method and apparatus for accessing internal nodes of an integrated circuit using IC package substrate have been described. While the present invention has been described in particular embodiments, it should be appreciated that the present invention should not be construed as limited by such embodiments but rather construed according to the following Claims.

The foregoing descriptions of specific embodiments of the present invention have been presented for purposes of illustration and description. They are not intended to be exhaustive or to limit the invention to the precise forms disclosed. The embodiments were chosen and described in order to best explain the principles of the invention and it's practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An integrated circuit comprising:
    an integrated circuit die comprising a principal side and having an internal circuit node;
    a conductive element formed on said principal side of said integrated circuit die and coupled to said internal circuit node;
    a package substrate comprising a principal side facing said principal side of said integrated circuit die;
    a conductive element mounted on said principal side of said package substrate and externally accessible to an integrated circuit testing apparatus;
    a transmission path wherein a first end of said transmission path is coupled to said conductive element of said integrated circuit die and wherein a second end of said transmission path is coupled to said externally accessible conductive element of said package substrate.

2. The integrated circuit as described in claim 1 wherein signals are transferred from said internal circuit node of said integrated circuit to said conductive element of said package substrate via said transmission path.

3. The integrated circuit as described in claim 1 wherein signals are transferred from said conductive element of said package substrate to said internal node via said transmission path.

4. The integrated circuit as described in claim 1 further comprising a plurality of internal circuit nodes; a plurality of transmission paths, coupled to said plurality of internal nodes; and a plurality of externally accessible conductive elements mounted on said principal surface of said package substrate and coupled to said plurality of transmission paths.

5. The integrated circuit as described in claim 1 wherein signals are transferred from a plurality of internal circuit nodes of said integrated circuit die to said conductive element of said package substrate via said transmission path.

6. The integrated circuit as described in claim 1 further comprising a plurality of conductive elements mounted on said principal side of said package substrate and externally accessible to said integrated circuit testing apparatus, and a plurality of transmission paths wherein said plurality of transmission paths are coupled to said plurality of said conductive elements of said package substrate.

7. The integrated circuit as described in claim 6 further comprising a signal selector coupled to said internal circuit node wherein signals from said internal circuit node are selectably coupleable to said plurality of conductive elements of said package substrate.

8. The integrated circuit as described in claim 7 further comprising an adjustable clock delay operable to capture said signals from said internal nodes at an adjustable time.

9. The integrated circuit as described in claim 6 further comprising a buffer coupled to said internal circuit node.

10. The integrated circuit as described in claim 9 wherein said internal circuit node is coupled to a shift register.

11. The integrated circuit as described in claim 10 further comprising a latch coupled to said internal node.

12. The integrated circuit as described in claim 1 wherein a portion of said package substrate extends past an edge of said integrated circuit die and wherein said conductive element extends past an edge of said integrated circuit die.

13. An integrated circuit comprising:
an integrated circuit die comprising a principal side;
a buffer comprising an input terminal coupled to an internal circuit node of said integrated circuit die;
a conductive element formed on said principal side of said circuit die coupled to an output terminal of said buffer;
a multi-layer package substrate comprising a principal side facing said principal side of said integrated circuit die;
a transmission path on a layer of said package substrate, wherein a first end of said transmission path is coupled to said conductive element of said circuit die; and
an externally accessible conductive region on said principal side of said package substrate coupled to a second end of said transmission path.

14. The integrated circuit as described in claim 13 further comprising a plurality of internal circuit nodes coupled to a corresponding plurality of transmission paths.

15. The integrated circuit as described in claim 13 wherein said internal circuit node is coupled to a shift register.

16. The integrated circuit as described in claim 15 further comprising a latch coupled to said internal circuit node.

17. The integrated circuit as described in claim 13 wherein said conductive element is a deformable ball bond.

18. The integrated circuit as described in claim 13 wherein said package substrate is a multi-layered insulative structure comprising a plurality of conductive paths.

19. The integrated circuit as described in claim 13 wherein a portion of said package substrate comprises a plurality of conductive regions and wherein said portion extends past an edge of said integrated circuit die.

20. The integrated circuit as described in claim 13 wherein a transmission path comprises at least one conductive via in said package substrate substantially perpendicular to said principal side of said package substrate.

21. The integrated circuit as described in claim 13 further comprising a heat sink thermally coupled to said integrated circuit die.

22. The integrated circuit as described in claim 13 wherein said transmission path has an impedance in the range of approximately 45 to 55 ohms.

* * * * *